United States Patent [19]

Neifeld

[11] Patent Number: 4,967,167

[45] Date of Patent: Oct. 30, 1990

[54] MICROWAVE TRANSMISSION LINE AND METHOD OF MODULATING THE PHASE OF A SIGNAL PASSED THROUGH SAID LINE

[75] Inventor: Richard A. Neifeld, Springfield, N.J.

[73] Assignee: The United States of America as represented by the Secretary of the Army, Washington, D.C.

[21] Appl. No.: 474,976

[22] Filed: Feb. 5, 1990

[51] Int. Cl.$^5$ .................... H03C 3/00; H03C 3/36; H01P 1/18; H01P 9/00
[52] U.S. Cl. .................................. 332/144; 333/157; 333/248
[58] Field of Search ................ 332/144; 333/157, 161, 333/164, 248

[56] References Cited

U.S. PATENT DOCUMENTS

| | | | |
|---|---|---|---|
| 4,263,570 | 4/1981 | De Fonzo et al. | 333/248 X |
| 4,506,234 | 3/1985 | Vittoria | 332/144 |
| 4,675,624 | 6/1987 | Rosen et al. | 333/164 X |

Primary Examiner—David Mis
Attorney, Agent, or Firm—Michael Zelenka; Roy E. Gordon

[57] ABSTRACT

A microwave transmission line is provided including a class of dielectric materials known as relaxor dielectrics having very high dielectric constants of greater than 1000, low dielectric loss and large variations of the real part of the dielectric constant with varying temperature. The phase of a microwave signal passed through such a transmission line is modulated by subjecting the transmission line to light that is absorbed in the dielectric layer causing a variation in the dielectric constant and a change in the velocity of the continuous microwave signal passing through the transmission line.

8 Claims, 1 Drawing Sheet

FIG.
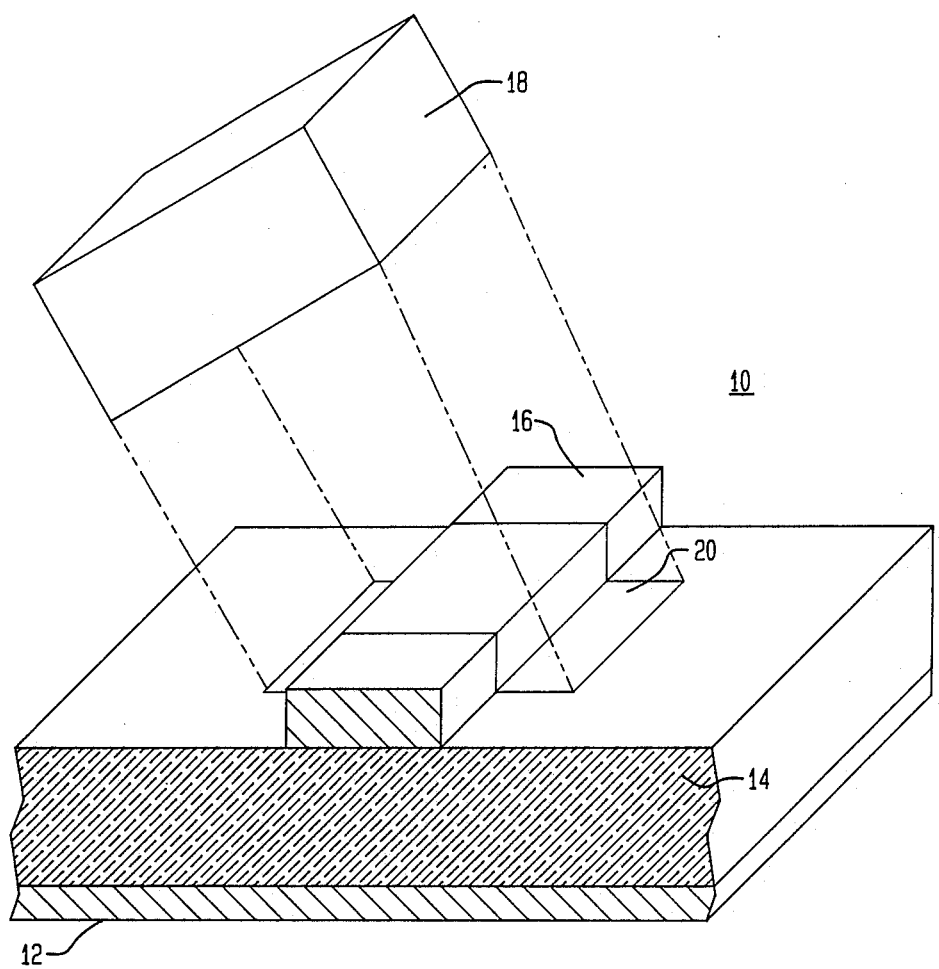

MICROWAVE TRANSMISSION LINE AND METHOD OF MODULATING THE PHASE OF A SIGNAL PASSED THROUGH SAID LINE

The invention described herein may be manufactured, used, and licensed by or for the Government for governmental purposes without the payment to me of any royalty thereon.

This invention relates in general to a microwave transmission line and to a method of modulating the phase of a signal passed through the transmission line, and in particular to a microwave transmission line including a class of dielectric materials known as relaxer dielectrics having very high dielectric constants of greater than 1000, low dielectric loss and large variations of the real part of the dielectric constant with varying temperature, and to a method of modulating the phase of a microwave signal passed through such a transmission line.

BACKGROUND OF THE INVENTION

Heretofore, phase modulation of microwave signals has been accomplished by rerouting the microwave signal through parallel transmission lines with different physical lengths. Since the phase change of a signal passed through a transmission line is a linear function of the length of the transmission line, each phase change has required an additional parallel transmission line.

SUMMARY OF THE INVENTION

The general object of this invention is to overcome the difficulties associated with the prior methods of modulation of the phase of a microwave signal.

A more particular object of this invention is to provide a microwave transmission line and a method of modulating the phase of a signal passed through such a line in which the phase can be modulated over a large range of phase, and in which the phase can be rapidly varied, and in which the transmission line occupies a small area, and in which very little power can provide a large phase shift.

It has now been found that the aforementioned objects can be attained by providing a microwave transmission line in which a thin relaxor dielectric layer is sandwiched between a ground plane and an electrically conducting strip line and in which modulation of the phase of a signal passed down the transmission line is effected by applying a light pulse to the dielectric part of the transmission line thereby rapidly changing the temperature of the relaxor dielectric to change the propagation velocity of the signal in the transmission line, thus modulating the pulse of the signal.

As the relaxor dielectric, one may use a composition of the elements Pb,Ti,Mg,Nb, and O that are crystallized in a perovskite structure and have the approximate chemical formula $Pb_1Ti_{1-x}(Mg_{1-y}Nb_y)_xO_3$ where variations of less than 5 percent from this composition may occur due to defects in the structure such as vacancies and interstitials.

These relaxor dielectrics have dielectric constants ranging from 2000 to 25,000 times that of the dielectric constant of free space and have dielectric loss tangents ranging from 0.1 to 0.0001, in the temperature range of 0 to 100 degrees Celsius.

The thickness of the layer of relaxor dielectric used in the transmission line and the width of the strip line used in the transmission line determine the characteristic impedance of the transmission line. Typically, microwave transmission line impedances in the range of 5 to 100 ohms are desired. This requires relaxor dielectric layer thicknesses of from 0.1 to 5.0 μm.

As the ground plane of the transmission line one may use any highly conducting metal of which palladium is preferred due to its resistance to oxidation by the relaxor dielectric.

As the stripline one may use any highly conducting metal of which gold is preferred, due to its resistance to oxidation and since it is compatible with existing processing techniques.

DESCRIPTION OF THE DRAWING

Referring to the drawing, a microwave transmission line, 10, includes a ground plane, 12, a relaxor dielectric layer, 14, overlaying the ground plane, 12, and metal stripline, 16, that overlays a portion of the relaxor dielectric layer, 14. A light source, 18, is positioned so that light emitted from it will impinge upon the transmission line structure covering an area, 20, as shown.

Light is absorbed in the dielectric layer beneath area, 20, creating heat. This changes the temperature of the dielectric layer thereby inducing a change in the dielectric constant. The temperature of the dielectric layer, 14, can be rapidly varied by application of light to area, 20, due to its thinness. Variation of the dielectric constant in the dielectric layer, 14, causes a change in the velocity of a signal traveling down the transmission line, 10, thereby effecting a phase modulation in the signal.

DESCRIPTION OF THE PREFERRED EMBODIMENT

A microwave transmission line is prepared in which a relaxor dielectric layer, $Pb_1Ti_{0.03}(Mg_{0.33}Nb_{0.67})_{0.97}O_3$, of 2 microns in thickness, is prepared by thin film in-situ growth on a metallic layer of Pd. The metallic Pd is the ground plane of the structure. A gold stripline is then prepared on the surface of the relaxor dielectric by the standard deposition and patterning methods. A continuous microwave signal is then passed through the transmission line. A light emitting diode that is situated above the transmission line is then turned on so that it's emitted light impinges upon the relaxor dielectric layer adjacent to the stripline. The phase of the signal is measured at the output of the transmission line and application of the light is shown to rapidly modulate the phase of the signal.

In lieu of the type of transmission line shown in the preferred embodiment, one might use any dielectric transmission line structure in which the dielectric layer is exposed in such a way that light can impinge upon it. Such transmission line structures include microstripline, coplanar stripline and inverted microstripline among others. Other relaxor dielectrics may come within the scope of this invention and include, among others $Pb(Fe_{1-x}Nb_x)O_3$, $Pb(Fe_{1-x}W_x)O_3$, and $Pb(Zn_{1-x}Nb_x)O_3$ where $0<X<1$ in all cases.

I wish it to be understood that I do not desire to be limited to the exact details of construction shown and described for obvious modifications will occur to a person skilled in the art.

What is claimed is:

1. A microwave transmission line including a metallic ground plane layer, a relaxor dielectric layer overlaying the metallic ground plane layer, and a metal stripline overlaying a portion of the relaxor dielectric layer and wherein the relaxor dielectric layer includes a dielectric material having a very high dielectric constant of greater than 1000, low dielectric loss and large variations of the real part of the dielectric constant with varying temperature.

2. A microwave transmission line according to claim 1 wherein the relaxor dielectric material has the approximate chemical formula $Pb_1Ti_{1-x}(Mg_{1-y}Nb_y)_xO_3$ where variations of less than 5 percent from this composition may occur due to defects in the structure such as vacancies and interstitials.

3. A microwave transmission line according to claim 2 wherein the relaxor dielectric layer has a thickness of about 0.1 to 5.0 m.

4. A microwave transmission line including a ground plane layer of palladium, a 2 m thick relaxor dielectric layer of $Pb_1Ti_{0.3}(Mg_{0.33}Nb_{0.67})_{0.97}O_3$ overlaying the palladium ground plane layer and a gold stripline overlaying a portion of the relaxor dielectric layer.

5. Method of modulating the phase of a continuous microwave signal passed through a microwave transmission line including a metallic ground plane layer, a relaxor dielectric layer overlaying the metallic ground plane layer, and a metal stripline overlaying a portion of the relaxor dielectric layer and wherein the relaxor dielectric layer includes a dielectric material having a very high dielectric constant of greater than 1000, low dielectric loss and large variations of the real part of the dielectric constant with varying temperature, said method comprising subjecting the transmission line to light that is absorbed in the dielectric layer causing a variation in the dielectric constant and a change in the velocity of the continuous microwave signal passing through the transmission line thereby effecting a phase modulation in the signal.

6. Method according to claim 5 wherein the relaxor dielectric material has the approximate chemical formula $Pb_1Ti_{1-x}(Mg_{1-y}Nb_y)_x O_3$ where variations of less than 5 percent from this composition may occur due to defects in the structure such as vacancies and interstitials.

7. Method according to claim 6 wherein the relaxor dielectric layer has a thickness of about 0.1 to 5.0 m.

8. Method of modulating the phase of a continuous microwave signal passed through a microwave transmission line including a ground plane layer of palladium, a 2 m thick relaxor dielectric layer of $Pb_1Ti_{0.3}(Mg_{0.33}Nb_{0.67})_{0.97}O_3$ overlaying the palladium ground plane layer and a gold stripline overlaying a portion of the relaxor dielectric layer, comprising subjecting the transmission line to light that is absorbed in the dielectric layer causing a variation in the dielectric constant and a change in the velocity of the continuous microwave signal passing through the transmission line thereby effecting a phase modulation in the signal.

* * * * *